(12) United States Patent
Bieniek et al.

(10) Patent No.: US 9,768,610 B2
(45) Date of Patent: Sep. 19, 2017

(54) METHOD AND CIRCUIT ARRANGEMENT WITH MEANS FOR A LEAKAGE CURRENT COMPENSATION IN A PHOTOVOLTAIC SYSTEM WITH MULTIPLE DIFFERENTIAL CURRENT SENSORS

(71) Applicant: SMA Solar Technology AG, Niestetal (DE)

(72) Inventors: Sebastian Bieniek, Frankenberg (DE); Markus Hopf, Espenau (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 14/997,740

(22) Filed: Jan. 18, 2016

(65) Prior Publication Data
US 2016/0134102 A1    May 12, 2016

Related U.S. Application Data

(63) Continuation of application No. PCT/EP2014/065252, filed on Jul. 16, 2014.

(30) Foreign Application Priority Data

Jul. 18, 2013  (DE) .......................... 10 2013 107 689

(51) Int. Cl.
*H02H 9/02*    (2006.01)
*G01R 19/10*    (2006.01)
(Continued)

(52) U.S. Cl.
CPC .............. *H02H 9/02* (2013.01); *G01R 19/10* (2013.01); *H01L 31/02021* (2013.01);
(Continued)

(58) Field of Classification Search
CPC . H02H 9/02; H02H 3/17; H02H 3/337; H02S 40/32; H02S 50/00; H02M 7/42; H01L 31/02021; G01R 19/10; Y02E 10/50
(Continued)

(56) References Cited

U.S. PATENT DOCUMENTS 6,747,856 B1 * 6/2004 Huber ..................... H02H 3/33
                                                    361/113
8,502,496 B2 * 8/2013 Hofheinz .............. B60L 3/0023
                                                    180/65.21
(Continued)

FOREIGN PATENT DOCUMENTS

EP    2372857 A1    10/2011

OTHER PUBLICATIONS

Received search report from STIC EIC 2800 searcher John DiGeronimo on Dec. 20, 2016.*

*Primary Examiner* — Timothy J Dole
*Assistant Examiner* — Htet Z Kyaw
(74) *Attorney, Agent, or Firm* — Eschweiler & Potashnik, LLC

(57) ABSTRACT

A method for leakage current compensation in a photovoltaic system includes determining a reference current flowing from at least one current-carrying line under voltage via a capacitor to earth, and generating a compensation current, having a phase and a frequency of the reference current, and having an amplitude adjusted by a negative scaling factor based on the reference current. The method further includes determining a current sum using a differential current sensor for at least a portion thereof, wherein the addends of the current sum are the currents through a complete set of current-carrying lines and the compensation current, minimizing the determined current sum by adjusting the scaling factor, and routing the compensation current through at least one other differential current sensor, such that the compen- (Continued)

sation current compensates a leakage current component of a differential current monitored by the other differential current sensor. A related device and system is also disclosed.

12 Claims, 2 Drawing Sheets

(51) Int. Cl.
| | |
|---|---|
| *H02H 3/17* | (2006.01) |
| *H02H 3/33* | (2006.01) |
| *H02S 50/00* | (2014.01) |
| *H01L 31/02* | (2006.01) |
| *H02S 40/32* | (2014.01) |
| *H02M 7/42* | (2006.01) |

(52) U.S. Cl.
CPC .............. *H02H 3/17* (2013.01); *H02H 3/337* (2013.01); *H02M 7/42* (2013.01); *H02S 40/32* (2014.12); *H02S 50/00* (2013.01); *Y02E 10/50* (2013.01)

(58) Field of Classification Search
USPC .......................................................... 363/55
See application file for complete search history.

(56) References Cited

U.S. PATENT DOCUMENTS

| | | | |
|---|---|---|---|
| 8,804,390 B2* | 8/2014 | Coors | H02J 3/383 |
| | | | 323/906 |
| 8,854,846 B2* | 10/2014 | Nuss | H02H 3/33 |
| | | | 324/522 |
| 9,065,345 B2* | 6/2015 | Rigbers | H02M 3/33523 |
| 9,244,110 B2* | 1/2016 | Ward | G01R 31/025 |
| 2003/0075211 A1 | 4/2003 | Makita et al. | |
| 2006/0221519 A1 | 10/2006 | Yang | |
| 2013/0043880 A1 | 2/2013 | Bettenwort et al. | |
| 2013/0070374 A1* | 3/2013 | Hofheinz | H02H 3/332 |
| | | | 361/42 |
| 2013/0121029 A1* | 5/2013 | Coors | H02J 3/383 |
| | | | 363/13 |
| 2013/0300428 A1* | 11/2013 | Bettenwort | G01R 31/025 |
| | | | 324/509 |
| 2014/0043880 A1* | 2/2014 | Nuss | H02M 7/44 |
| | | | 363/95 |
| 2014/0306544 A1 | 10/2014 | Hantschel et al. | |
| 2014/0312877 A1* | 10/2014 | Kammer | G01R 19/10 |
| | | | 324/76.11 |
| 2015/0137850 A1* | 5/2015 | Falk | G01R 31/025 |
| | | | 324/764.01 |

* cited by examiner

METHOD AND CIRCUIT ARRANGEMENT WITH MEANS FOR A LEAKAGE CURRENT COMPENSATION IN A PHOTOVOLTAIC SYSTEM WITH MULTIPLE DIFFERENTIAL CURRENT SENSORS

CROSS REFERENCE TO RELATED APPLICATIONS

This application claims priority to International Patent Application number PCT/EP2014/065252, filed on Jul. 16, 2014, which claims priority to German Patent Application number 10 2013 107 689.0, filed on Jul. 18, 2013, and is hereby incorporated in its entirety.

FIELD

The disclosure relates to a method for leakage current compensation in a photovoltaic system. Furthermore, the disclosure relates to a circuit arrangement for leakage current compensation in a photovoltaic system. The disclosure additionally relates to a photovoltaic inverter. The circuit arrangement and also the photovoltaic inverter are provided, for example, to execute the method according to the disclosure. The photovoltaic inverter in this case may be part of the circuit arrangement. The photovoltaic system comprises at least one photovoltaic generator, in addition to the circuit and the photovoltaic inverter.

BACKGROUND

A method, a circuit arrangement, and a photovoltaic inverter are known from EP 2 372 857 A1. This publication deals with the determination of the fault current component of a differential current, which is determined as a current sum over lines carrying the current of an alternating current generator. For this purpose, an electrical signal is generated by a reference current, caused by voltages at the alternating current generator, through capacitors, to earth. The electrical signal is multiplied by a scaling factor, and the electrical signal, scaled in such a manner, is subtracted, as a measure of a capacitive leakage current component, from the differential current. The scaling factor is continuously adjusted such that the effective value of the differential current is minimized after subtraction of the scaled electrical signal. The subtraction of the scaled electrical signal from the differential current may be effected by means of the summation current transformer that determines the differential current. The effective value of the differential current minimized by subtraction of the scaled electrical signal is the effective value of the fault current, i.e. the differential current still determined by the summation current transformer is the pure fault current component, which can thus be monitored selectively.

It is frequently necessary, in addition to using an RCMU (Residual Current Monitoring Unit), required according to the product standard EN 62109, as a differential current sensor within an electrical device such as, for example, a photovoltaic inverter, to use one or more external RCDs (Residual Current Protection Devices) as additional differential current sensors. These fault current protection means monitor a differential current for conformity with threshold values, but do not normally measure it quantitatively. Even if the compensation of the leakage current component, known from EP 2 372 857 A1, is performed on the differential current within a photovoltaic inverter, this does not prevent erroneous tripping of the external RCDs as a result of high leakage current components of the differential currents monitored by the latter.

It is known from "ABB Technische Information, Fehlerstromschutzschaltung, unerwünschte Auslösungen von Fehlerstromschutzschaltern", Version 2010 5/C, ABB Schweiz AG, using a three-phase earth-fault circuit interrupter for monitoring of a load with a high leakage capacitance linked between a neutral conductor and one phase conductor. In this case, a compensation capacitor is connected, on the side of the summation current transformer facing back toward the load, between the connection of the phase conductor and a connection of an otherwise unused current path through the summation current transformer. Outside of this summation current transformer the input side of this current path is connected to the connection for the neutral conductor on the output side. In the case of this circuit arrangement an additional capacitive leakage current flows, via the phase conductor, to the compensation capacitor in addition to a differential current resulting from a capacitive leakage current from the load. This additional leakage current flows, besides the phase conductor, twice in the opposite direction through the summation current transformer, namely, on the one hand, via the otherwise unused current path and, on the other hand, via the neutral conductor. In this way, a part of the capacitive leakage current flowing away from the load is compensated, i.e. not determined by the summation current transformer. Limits apply to the compensation capacitor in order that, in the case of a load having been switched off, the leakage current via the compensation capacitor does not trip an earth-fault circuit interrupter comprising the summation current transformer.

SUMMARY

The disclosure is based on the object of significantly increasing, in a simple manner, the robustness of the protection of a photovoltaic system by further fault current protection means, in particular those that do not themselves determine the actually flowing differential current, despite the greatly fluctuating leakage capacitances of photovoltaic generators. When it is mentioned in this description that a value is determined, this means that it is determined quantitatively, i.e. in respect of its present magnitude. However, this magnitude need not be determined with precision. Rather, it is sufficient, for example, that a signal that rises and falls with the present magnitude of the value is output as a result of the determining of the value, a fixed relationship between the amplitude of the signal and the magnitude of the value being preferred. To that extent, the "determining" of the value does not necessarily mean here that the value is measured in any physical unit for the value.

When, in this description, mention is made of a differential current sensor, without further details, this sensor may monitor and/or determine a differential current. Even the outputting of a signal that rises and falls with the present magnitude of the value is not imperative for the monitoring of a differential current by means of a differential current sensor. Thus, the differential current may also be monitored only in such a manner that it is compared with one or more limit value(s), and a signal is output if it exceeds one of the limit values. This signal may be the tripping of a fault current protection device. Thus, in principle, a differential current sensor may be both an RCMU and an RCD, and also of another design. It will normally have a summation current transformer.

When, in this description, mention is made of the minimizing of a current sum, this means at least that a signal or a value that rises and falls with the present magnitude of the current sum is minimized. In particular, the minimizing of the time-variable current sum means that its effective value is minimized.

When it is mentioned in this description that an alternating current has an amplitude adjusted by a negative factor with respect to another alternating current, the fact that the factor is negative means that the one alternating current is in phase opposition to the other alternating current.

A current-carrying line, in this description, is to be understood to be a line that is provided inside a photovoltaic system for the purpose of carrying current from a photovoltaic generator to the output of the photovoltaic system. This also includes neutral conductors. Neutral conductors, however, are not current-carrying lines under voltage. These include only phase conductors on the alternating current side and, on the direct current side, the connecting lines connected to the photovoltaic generators, unless they are earthed.

In the case of a method according to the disclosure for leakage current compensation in a photovoltaic system, a reference current flowing is determined from at least one current-carrying line under voltage to earth via a capacitor. A compensation current, having the phase and frequency of the reference current, and having an amplitude adjusted by a negative scaling factor with respect to the reference current, is generated. A current sum is determined by means of a differential current sensor, the addends of the current sum being the currents through a complete set of current-carrying lines and the compensation current. The determined current sum is minimized by adjusting the scaling factor. The compensation current is then routed through at least one other differential current sensor, such that the compensation current compensates a leakage current component of a differential current monitored by means of the other differential current sensor.

That the current sum that comprises the compensation current is determined by means of a differential current sensor and is minimized according to the disclosure, does not mean that the entire current sum needs be determined by the differential current sensor, for example by means of a summation current transformer. The one differential current sensor may also form only a partial current sum, for the currents through the complete set of current-carrying lines, the current sum that also contains the compensation current then being formed elsewhere, for example following digitizing of both the partial current sum, by the differential current sensor, and of the compensation current. It is simpler, however, if the compensation current is also carried through the summation current transformer of the one differential current sensor, such that the latter directly determines the entire current sum.

It is to be noted that the compensation current may also be contained in the currents that flow through the complete set of current-carrying lines. This is to be explained in greater detail.

A complete set of current-carrying lines is to be understood to be, for example, all lines that carry the alternating current output by the photovoltaic system, including a corresponding neutral conductor. Another complete set of current-carrying lines comprises all input lines via which the photovoltaic generator or generators is/are connected to a photovoltaic inverter of the photovoltaic system.

In the case of the present disclosure, a compensation current, such as that used in EP 2 372 857 A1 for the purpose of selectively determining the fault current component, is used to suppress a leakage current component of a differential current determined by means of an RCMU, in addition to the compensation of the leakage current component in the case of at least one further differential current sensor. For this purpose, the compensation current, which is optimized continuously with respect to the scaling factor present therein, is routed through the at least one further differential current sensor. Since, in principle, the same differential current should flow through the further differential current sensor, which monitors the same or another complete set of current-carrying lines, its leakage current component is also compensated to the best possible extent by means of the compensation current. A tripping threshold of the at least one further differential current sensor can thus be set relatively low for a high degree of safety in respect of fault currents, without a circuit breaker being tripped unnecessarily by the differential current sensor. This also applies in the case of very large and fluctuating leakage capacitances of connected photovoltaic generators, the effects of which are compensated in corresponding magnitude by the compensation current. In this way, the safety of the entire photovoltaic system, consisting of photovoltaic generators, photovoltaic inverters and external protection means, is increased and, at the same time, the probability of erroneous tripping is reduced, this in turn contributing overall to more reliable operation of the photovoltaic system.

Execution of the method according to the disclosure does not require all further differential current sensors to be capable of outputting a value, or even only a measure, for the differential current monitored by them. They may be, for example, RCDs.

In principle, in the execution of the method according to the disclosure, an otherwise unused current path through the at least one other differential current sensor can be used to route the compensation current, on this current path, through the at least one other differential current sensor. However, such unused current paths are not normally available, for example because an external differential current sensor for a three-phase photovoltaic inverter has only four current paths, which are occupied by the three phases and the neutral conductor. The situation may be different if a single-phase inverter is monitored by means of a three-phase differential current sensor, since then, in principle, two current paths are free. In each case, in the case of the method according to the disclosure, the compensation current can be routed on the neutral conductor through the at least one other differential current sensor, such that no additional current path is required for this. In the case of a differential current occurring, a current also usually flows in any case via the neutral conductor, which current tends to be reduced by means of the compensation current. Moreover, in the case of the disclosure, the compensation current only flows when a leakage current also occurs.

Specifically, the compensation current may be carried through a conductor loop that extends through all differential current sensors at which the leakage current component of the monitored differential current is compensated. For this purpose, the loop may go forward as far as before the differential current sensor that is farthest from the photovoltaic generator, and return through all differential current sensors at which the leakage current component of the monitored differential current is compensated. If the conductor loop includes the neutral conductor, or a portion of the neutral conductor, the part of the conductor loop that goes beyond the latter, before and after the respectively last differential current sensor at which the leakage current component of the monitored differential current, is to be connected to the neutral conductor.

The compensation current may also be carried through a differential current sensor used to determine the current sum that is minimized in the adjustment of the scaling factor. The current sum is then determined directly, in the form of the differential current determined by the differential current sensor, and it is sufficient to minimize the output signal of the one differential current sensor, which rises and falls with the current sum determined in the form of the differential current, by adjustment of the scaling factor for the reference current.

A circuit arrangement according to the disclosure for leakage current compensation in a photovoltaic system comprises at least one capacitor, connected in circuit between a current-carrying line under voltage and earth, a current determining means, for determining a reference current flowing, via the at least one capacitor, to earth, and a current source, for generating a compensation current, having the phase and frequency of the reference current, and having an amplitude adjusted by a negative scaling factor in respect of the reference current. The circuit arrangement further comprises a current sum determining means, comprising a differential current sensor, for determining a current sum, the addends of the current sum being the currents through a complete set of current-carrying lines and—contained therein or separate—the compensation current, a logic circuit, for minimizing the determined current sum by adjusting the scaling factor, and a conductor loop for routing the compensation current through at least one other differential current sensor, such that the compensation current compensates a leakage current component of a differential current monitored by means of the other differential current sensor.

In one embodiment the conductor loop comprises a portion of a neutral conductor through the at least one other differential current sensor. This conductor loop, in turn, may extend through a plurality of differential current sensors. The latter may also include the differential current sensor included in the current sum sensing means, such that the current sum determining means determines the current sums in the form of the differential current determined by the one differential current sensor.

A photovoltaic inverter according to the disclosure is disclosed having an input, to which a photovoltaic generator can be connected, an output, for outputting an alternating current, and an earth connection, for connecting to earth. The photovoltaic inverter further includes a differential current sensor, which determines a differential current, at least one capacitor, connected in circuit between a current-carrying line under voltage and the earth connection, and a current determining means, for determining a reference current flowing, via the at least one capacitor, to the earth connection. The inverter also comprises a current source, for generating a compensation current, having the phase and frequency of the reference current, and having an amplitude adjusted by a negative scaling factor in respect of the reference current, a current sum determining means, comprising the differential current sensor, for determining a current sum, the addends of the current sum being the currents through a complete set of current-carrying lines and—contained therein or separate—the compensation current, and a logic circuit, for minimizing the determined current sum by adjusting the scaling factor. The logic circuit includes, according to the disclosure, two connections at the output, between which, when they have been electrically connected to each other, flows the compensation current generated by the current source.

The part of a conductor loop that extends outside of the photovoltaic inverter and that carries the compensation current through all differential current sensors at which the leakage current component of the monitored differential current is to be compensated can be connected to these connections.

The two connections at the output for the compensation current may comprise a connection for a neutral conductor of the alternating current output at the connection. The other connection for the compensation current may be the earth connection of the photovoltaic inverter, or a connection, additional thereto, for a so-called functional earth.

If a line extends from the current source for the compensation current to one of the two connections through the differential current sensor that belongs to the current sum determining means, the current sum determining means determine the current sum in the form of the differential current determined by the differential current sensor. This means that the current sum is formed directly by the one differential current sensor.

Advantageous developments of the disclosure are given by the claims, the description and the drawings. The advantages of features, and of combinations of a plurality of features, stated in the description are merely exemplary, and may apply alternatively or cumulatively, without the advantages necessarily having to be achieved by embodiments according to the disclosure. Without the subject-matter of the appended claims being altered thereby, the following applies in respect of the disclosure content of the original application documents and of the patent: further features are given by the drawings—in particular the represented relative arrangements and operative connections of a plurality of components. The combination of features of differing embodiments of the disclosure, or of features of differing claims, is likewise possible, notwithstanding the selected back-references of the claims, and is hereby suggested. This also relates to such features that are represented in separate drawings or mentioned in the description thereof. These features may also be combined with features of differing claims. Likewise, features mentioned in the claims may be inapplicable to further embodiments of the disclosure.

The features stated in the claims and in the description are to be understood, in respect of their number, such that precisely this number, or a number greater than the stated number, is present, without need for an explicit use of the adverb "at least". Thus, if mention is made of an element, for example, this is to be understood to mean that precisely one element, two elements or more elements are present. These features may be supplemented by other features, or may be the only features of which the respective product consists.

The references contained in the claims do not constitute any limitation of the scope of the subject-matters protected by the claims. They merely serve the purpose of making the claims easier to understand.

BRIEF DESCRIPTION OF THE DRAWINGS

The disclosure is explained and described further in the following on the basis of preferred exemplary embodiments represented in the figures.

DETAILED DESCRIPTION

Figure 1:
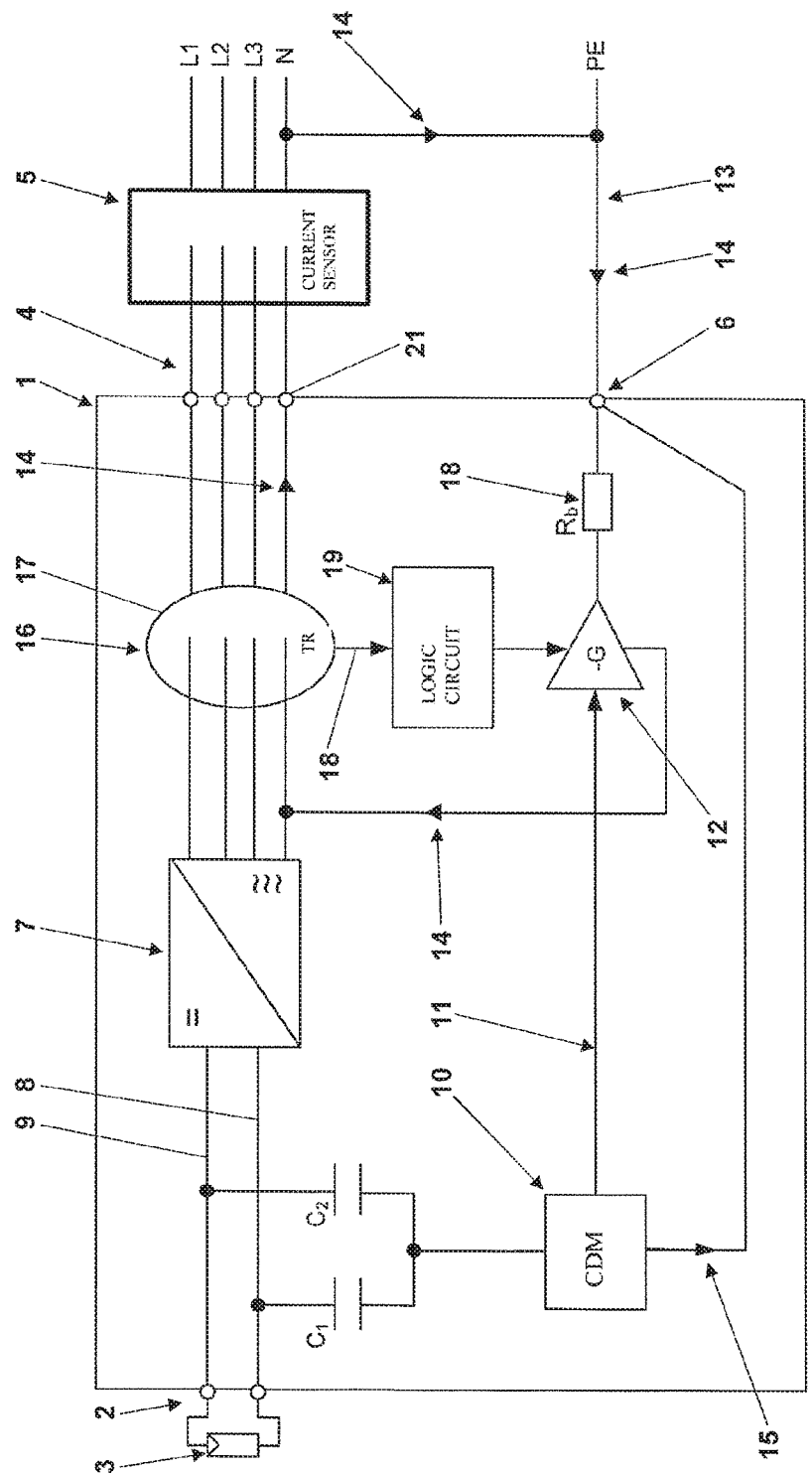
FIG. 1 shows a photovoltaic system having a circuit arrangement according to the disclosure, in a first embodiment.

In the case of the photovoltaic system shown in FIG. 1, a photovoltaic inverter 1 is connected, by an input 2, to the a photovoltaic generator 3. An alternating current, which in this case is three-phase, is output, via lines L1, L2, L3 and N, at an output 4 of the photovoltaic inverter 1, a connection 21 being provided for the N conductor. All current-carrying lines L1, L2, L3 and N are carried through an external differential current sensor 5, which, as a fault-current protective means, externally protects the photovoltaic inverter 1 together with the photovoltaic generator 3. Specifically, the differential current sensor 5 is a Residual Current Protection Device (RCD). At its output 4, the photovoltaic inverter 1 has an additional connection 6 for earth PE.

A DC/AC converter 7, which converts an input direct current from the photovoltaic generator 3 into the output alternating current, is provided in the photovoltaic inverter 1, between the input 2 and the output 4. On the DC side of the DC/AC converter 7, the two current-carrying lines 8 and 9 are each connected, via a capacitor C1 and C2, respectively, to the connection 6 and beyond that to earth. A reference current flowing via this connection is determined by means of a current determining means 10. An output signal 11 of the current determining means 10 is applied at a control input of a current source 12. The current source 12 generates a compensation current that, via a negative scaling factor-G, depends on the reference current, which is determined by the current determining means 10. This compensation current flows in a conductor loop 13, as indicated by arrow tips 14. The direction of the arrow tips 14 in this case indicates the phase opposition of the compensation current to the reference current, the direction of which is indicated by an arrow tip 15. The conductor loop 13 comprises a portion of the neutral conductor N on the AC side of the DC/AC converter 7. Between the DC/AC converter 7 and a differential current sensor 16, realized as an RCMU, comprising a summation current transformer 17, the conductor loop 13 branches off to the current source 12. From the current source 12, it extends through a limiting resistor $R_b$ to the connection 6, from there over a portion of a line that leads to earth PE and that, on the output side of the differential current sensor 5, is again connected to the neutral conductor N. The compensation current thus flows through both the external differential current sensor 5 and through the summation current transformer 17 of the differential current sensor 16. The current sum 18 determined by the summation current transformer 17 thus also comprises the compensation current. A logic circuit 19 acts upon the current source 12, irrespective of the effective value of the current sum 18, by changing the gain factor-G, in order to minimize the effective value of the current sum 18. Owing to the compensation current being in phase opposition to the reference current, the current sum 18 then attains a minimum precisely when the compensation current completely compensates the leakage current component of the differential current determined by means of the summation current transformer 17. The leakage current component of the differential current is due, in particular, to leakage capacitances of the photovoltaic generator 3, but also comprises the reference current flowing via the capacitors C1 and C2, the entire leakage current component being in phase with the reference current. Since the compensation current over the conductor loop 13 is also carried through the differential current sensor 5, in the case of the compensation current monitored by the latter the leakage current is also compensated to the best possible extent. As a result of the continuous adjustment of the scaling factor-G, this compensation follows the actual, present leakage capacitances and the actual leakage currents that are therefore flowing. Erroneous tripping of the differential current sensor 5, realized as an RCD, is thus avoided, even if the RCD is tightly dimensioned with respect to the allowable differential current.

Figure 2:
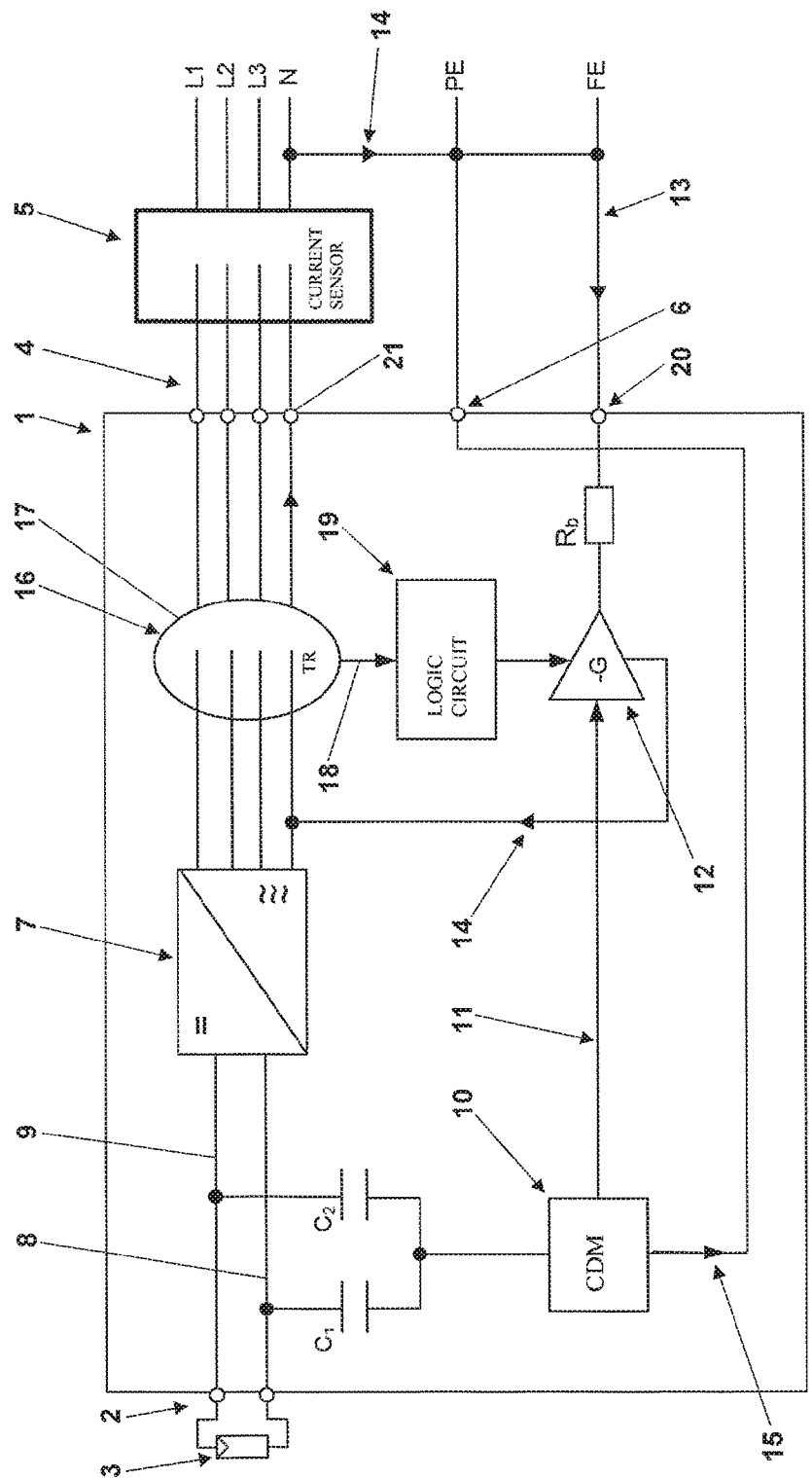
FIG. 2 shows a photovoltaic system having a circuit arrangement according to the disclosure, in a second embodiment.

In the case of the embodiment of the circuit arrangement, according to the disclosure, of the photovoltaic system according to FIG. 2 and the photovoltaic inverter 1 belonging thereto, there are the following differences in comparison with FIG. 1: The conductor loop 13, through which the compensation current flows, does not go via the connection 6 for earth PE, but via a separate connection 20 of the output 4. This connection 20 is provided for a functional earth FE, which, although it can be connected to earth PE, just like the neutral conductor N connected to the connection 21, nevertheless does not provide the actual earthing of the photovoltaic inverter 1. However, none of the basic function of the circuit arrangement, in respect of the compensation of capacitive leakage currents, is altered as a result. This embodiment may be indicated if operating regulations exist that prohibit compensation currents from being lead in on lines for earth PE.

In both FIGS. 1 and 2, two capacitors C1 and C2 are provided, which are each connected in circuit between one of the lines 8 and 9 and earth PE, to enable the capacitive reference current to be determined. The reference current can also be determined, however, only if it flows from one of the lines 8, 9 under voltage, via the capacitor C1 or C2 connected thereto, to earth PE. In principle, the reference current may also be carried via a capacitor that is connected in circuit between one of the conductors L1, L2 and L3 and earth PE. The earth PE, to which the reference current flows away, may be provided, moreover, by a separate earthing of the photovoltaic inverter 1, which is independent of the connection 6. Conversely, the differential current sensor 16, with the summation current transformer 17, may also be disposed on the DC side of the DC/AC converter 7.

The invention claimed is:

1. A method for leakage current compensation in a photovoltaic system, comprising:
    determining a reference current flowing from at least one current-carrying line under voltage via a capacitor to earth;
    generating a compensation current, having a phase and a frequency of the reference current, and having an amplitude adjusted by a negative scaling factor based on the reference current;
    determining a current sum using a differential current sensor for at least a portion thereof, wherein addends of the current sum are currents through a complete set of current-carrying lines and the compensation current;
    minimizing the determined current sum by adjusting the negative scaling factor;
    routing the compensation current through at least one other differential current sensor, such that the compensation current compensates a leakage current component of a differential current monitored by the at least one other differential current sensor.

2. The method as claimed in claim 1, wherein the compensation current is routed on a neutral conductor through the at least one other differential current sensor.

3. The method as claimed in claim 1, wherein the compensation current is carried through a conductor loop that extends through all differential current sensors at which the leakage current component of the monitored differential current is compensated.

4. The method as claimed in claim 1, wherein the compensation current is also carried through the differential current sensor, in order to determine the current sum in the form of the differential current determined by the differential current sensor.

5. A circuit arrangement for leakage current compensation in a photovoltaic system, the circuit arrangement comprising:
- at least one capacitor connected between a current-carrying line under voltage and earth;
- a current determining element for determining a reference current flowing, via the at least one capacitor, to earth;
- a current source configured to generate a compensation current having a phase and a frequency of the reference current, and having an amplitude adjusted by a negative scaling factor based on the reference current;
- a differential current sensor for determining at least a portion of a current sum, wherein addends of the current sum determined are currents through a complete set of current-carrying lines and the compensation current; and
- a logic circuit configured to minimize the determined current sum by adjusting the negative scaling factor;
- a conductor loop configured to route the compensation current through at least one other differential current sensor such that the compensation current compensates a leakage current component of a differential current monitored by the at least one other differential current sensor.

6. The circuit arrangement as claimed in claim 5, wherein the conductor loop comprises a portion of a neutral conductor through the at least one other differential current sensor.

7. The circuit arrangement as claimed in claim 5, wherein the conductor loop extends through a plurality of differential current sensors.

8. The circuit arrangement as claimed in claim 5, wherein the conductor loop extends through the differential current sensor, the differential current sensor determining the current sum in the form of the differential current.

9. A photovoltaic inverter, comprising:
- an input to which a photovoltaic generator can be connected;
- an output configured to output an alternating current;
- an earth connection for connecting to earth;
- a differential current sensor configured to determine a differential current;
- at least one capacitor connected between a current-carrying line under voltage and the earth connection;
- a current determining element for determining a reference current flowing, via the at least one capacitor, to the earth connection;
- a current source configured to generate a compensation current, having a phase and a frequency of the reference current, and having an amplitude adjusted by a negative scaling factor based on the reference current;
- wherein the differential current sensor is configured for determining a current sum, wherein addends of the current sum are currents through a complete set of current-carrying lines and the compensation current, and wherein the differential current sensor determines at least the currents through the complete set of current-carrying lines; and
- a logic circuit configured to minimize the determined current sum by adjusting the negative scaling factor;
- two connections between which the compensation current generated by the current source flows when they have been electrically connected to each other.

10. The photovoltaic inverter as claimed in claim 9, wherein the two connections comprise a connection for a neutral conductor of the output alternating current.

11. The photovoltaic inverter as claimed in claim 9, wherein the two connections comprise, at the output, the earth connection or a connection additional thereto for a functional earth.

12. The photovoltaic inverter as claimed in claim 9, further comprising a line that extends from the current source to one of the two connections through the differential current sensor such that the current sum in the form of the differential current is determined by the differential current sensor.

* * * * *